(12) United States Patent
Tokashiki et al.

(10) Patent No.: US 6,391,772 B1
(45) Date of Patent: May 21, 2002

(54) METHOD FOR FORMING INTERCONNECTS IN SEMICONDUCTOR DEVICE

(75) Inventors: Ken Tokashiki; Eiichi Soda, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/635,104

(22) Filed: Aug. 9, 2000

(30) Foreign Application Priority Data

Aug. 10, 1999 (JP) ............................................. 11-226189

(51) Int. Cl.[7] ............................................... H01L 21/44
(52) U.S. Cl. ......................... 438/672; 438/299; 438/669
(58) Field of Search ................................. 438/192, 299, 438/585, 597, 669, 672

(56) References Cited

FOREIGN PATENT DOCUMENTS

JP          11-111677     *   4/1999

OTHER PUBLICATIONS

Hashimoto, K., "New Phenomena of Charge Damage in Plasma Etching: Heavy Damage Only through Dense–Line Antenna", Appl. Phys. vol. 32, Part 1, No. 12B, pp. 6109–6113, Dec. 1993.

* cited by examiner

*Primary Examiner*—Long Pham
(74) *Attorney, Agent, or Firm*—Hayes Soloway P.C.

(57) ABSTRACT

A method for forming interconnects of a semiconductor device in which an amount of the fluorocarbon-based gas in an etching gas is adjusted to form a side-wall film which has a film thickness not less than a critical film thickness. In the present invention, the damage of a gate electrode and a gate dielectric film, due to charging imbalance caused by an electron shading effect during the etching of an interconnect layer, can be prevented.

11 Claims, 7 Drawing Sheets

METHOD FOR FORMING INTERCONNECTS IN SEMICONDUCTOR DEVICE

BACKGROUND OF THE INVENTION (a) Field of the Invention

The present invention relates to a method for forming interconnects in a semiconductor device, more in detail to the method for forming the optimum interconnects in the semiconductor device such as a MOSFET in which charging damages caused by an electron shading effect are suppressed during the formation of the interconnects by etching an interconnect layer deposited on a dielectric layer.

(b) Description of the Related Art

The structure of a semiconductor device such as a MOSFET having a desired interconnect pattern is conventionally prepared by forming an etching mask having the desired interconnect pattern on an interconnect layer deposited on an interlayer dielectric layer and etching the interconnect layer underlying the etching mask by means of a dry-etching process.

For etching the interconnect layer such as an aluminum interconnect layer, a chlorine-based gas such as chlorine ($Cl_2$) gas, trichloroboron ($BCl_3$) gas or the mixture thereof is used as an etching gas.

When the interconnect layer is etched by using only the chlorine-based gas, the side walls of the interconnect formed by the etching are further etched by the etching gas to make the interconnect thinner This phenomenon is referred to as a side etching. For suppressing the side etching, fluorocarbon-based gas such as $CHF_3$ and $CH_2F_2$, nitrogen gas or $CH_4/Ar$ is added to the etching gas. The addition of these gases to the chlorine-based gas forms side-wall films deposited on the side walls of the interconnects by depositing, on the side walls, the polymerized reaction product formed in the gas phase or by the reaction with a photoresist film, and the deposited side-wall films protect the interconnects.

In the dry processes used for fabricating the semiconductor device, especially in the dry-etching process utilizing plasma, problems arise such as charge-up damages caused by charged particles in the plasma.

The main causes of the charge-up damages have been recognized due to the spatial non-uniformity of the plasma. The spatial non-uniformity of the plasma density, the plasma potential and the electron temperature generate the potential between a gate electrode and a substrate to apply an electric stress on the region beneath the gate electrode, thereby arising problems such as the deterioration of the gate oxide film and the increase of the gate leakage current.

When an antenna ratio which is an index defined by a ratio of an area of a metal interconnect to a gate area is large, the influence of the charge-up damages appears more prominent.

The recent improvement of the etching apparatus elevated the regularity of the plasma and considerably suppressed the charging damages due to the plasma non-uniformity.

However, a new charging damage mode referred to as an electron shading damage has been found.

The electron shading damage is described in Jpn. J. Appl. Phys., 32, 6109 (1993) by K. Hashimoto. This publication describes that the electron shading damage depending on the interconnect structure (especially, the aspect ratio) and the electron temperature for controlling the nature of the plasma can be effectively suppressed by reducing the aspect ratio of the interconnect and the electron temperature.

Conventionally, the antenna ratio was not so large, the aspect ratio of the interconnect was not so large and the gate oxide film was thicker. Accordingly, the influence of the charge-up damage was not prominent.

The recent undersize of the semiconductor device provides the thinner gate oxide film and the increased interconnect aspect ratio and antenna ratio.

Conventionally, the electron shading damage is suppressed by increasing the gas pressure for reducing the electron temperature. However, in the finer process, the lower pressure is favorable and the reduction of the electron temperature under the lower pressure is difficult. The reduction of the interconnect aspect ratio is not easy because of the restriction on the circuit design of the semiconductor device. In addition, the relation between the interconnection formation by means of the dry-etching process and the charging damage is not completely elucidated.

SUMMARY OF THE INVENTION

In view of the foregoing, an object of the present invention is to provide a method for forming interconnects in a semiconductor device, which suppresses charging damages based on a clarified causal relation between dry-etching conditions for the interconnects and the charging damages of the semiconductor device, for example, between variation of a threshold voltage of a MOSFET which is an index of the charging damages and the etching conditions.

The present invention provides a method including the steps of: depositing an interconnect layer on an insulator layer overlying a substrate; and etching the interconnect layer by using an etching gas to form a plurality of interconnects extending with a specified line space, said etching step depositing a side-wall film on each side wall of each of said interconnects; said etching step including adjusting an amount of a fluorocarbon-based gas added to said etching gas to control a thickness of said side-wall film based on the specified line space, said side-wall film having at least a critical thickness for suppressing etching of the corresponding side wall.

In accordance with the method of the present invention, the damage of the semiconductor device, for example, the damage of a gate electrode and a gate dielectric film of a MOSFET, due to charging imbalance caused by an electron shading effect during the etching of an interconnect layer, can be prevented, The above and other objects, features and advantages of the present invention will be more apparent from the following description.

PREFERRED EMBODIMENTS OF THE INVENTION

Now, the present invention is more specifically described with reference to accompanying drawings.

Figure 1A:
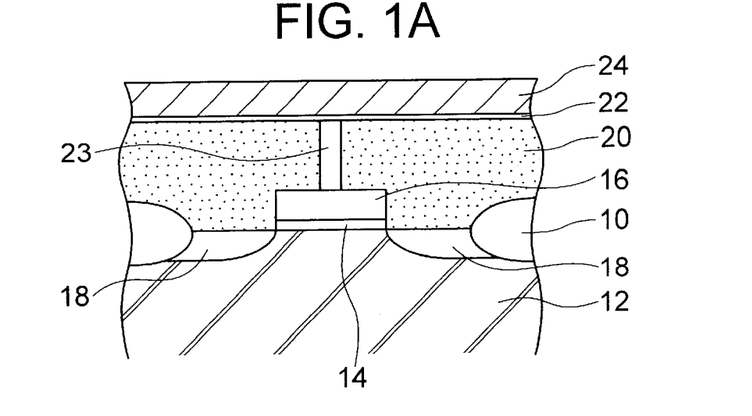
FIGS. 1A to 1C are cross-sectional views sequentially showing each of steps for forming interconnects of a MOSFET in accordance with an embodiment of the present invention.
Figure 1B:
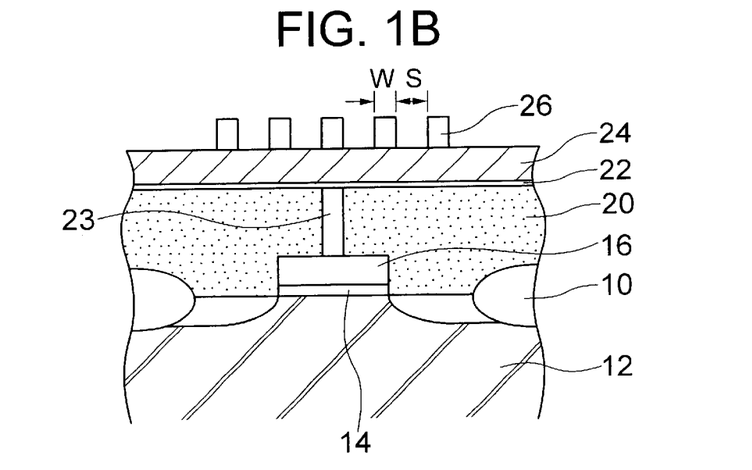
Figure 1C:
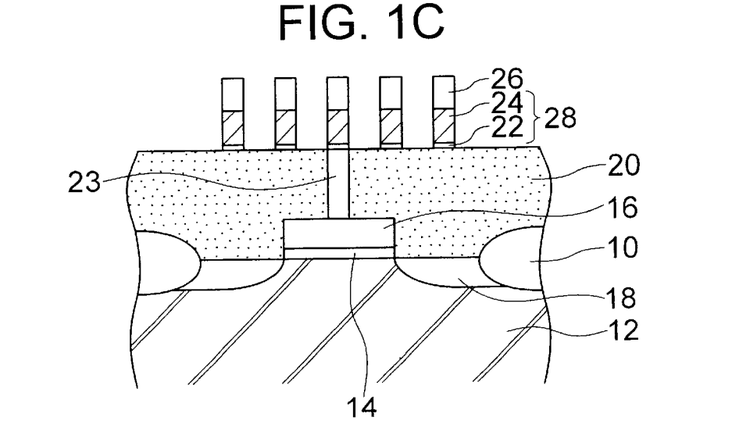

An embodiment shown in FIGS. 1A to 1C is a method for forming interconnects of an n-channel MOSFET, and may be applied to form the interconnects connected to a gate electrode by way of a via plug.

As shown in FIG. 1A, interconnects were formed overlying a dielectric film 20 of a wafer. The wafer included a gate electrode 16 overlying a silicon substrate 12 by way of a gate dielectric film 14 in an element forming region divided by an element isolation region 10, an n-type diffused region 18 formed in the silicon substrate 12 corresponding to the both sides of the gate electrode 16, and the dielectric film 20.

At first, as shown in FIG. 1A, a via plug 23 penetrating the dielectric film 20 for connection with the gate electrode 16 was formed, and a barrier metal layer 22 having a thickness of 1200 Å and an interconnect layer 24 having a thickness of 6000 Å were deposited on the dielectric film 20 by a sputtering method. The barrier metal layer 22 was a composite layer formed by TiN layer (film thickness of 1000 Å)/Ti layer (film thickness of 200 Å), and the interconnect layer 24 contained 0.5% in weight of copper and a balance of aluminum.

Then, a photoresist film was formed, and as shown in FIG. 1B, an etching mask 26 was photolithographically formed having an interconnect pattern having a line width "W" of 0.28 μm, and a space between the interconnects (interconnect interval) of 0.3 μm.

Then, an aluminum interconnect layer was etched under the following conditions by employing an inductive coupling type etching device to form interconnects 28 including the barrier metal layer 22 and the interconnect layer 24 on the dielectric film 20 as shown in FIG. 1C.
Etching Conditions
 Pressure: 15 mTorr.
 Temperature: 60° C.
 RF Source Power Input: 600 W
 RF Bias Power Input: 200 W
 Etching Gas: $BCl_3$/100 sccm, Cl/60 sccm, $CHF_3$/30 sccm The interconnect formed in the present embodiment had a side-wall film having a thickness of 80 nm on the side wall of the outermost interconnect, and had no evidence of occurring side etching because of the side-wall film having the thickness more than a critical film thickness described later Since a variation amount of a threshold voltage of the MOSFET (ΔVt) was 0.1 V, the charging damage was judged to be within a permitted range as described later.

Figure 2:
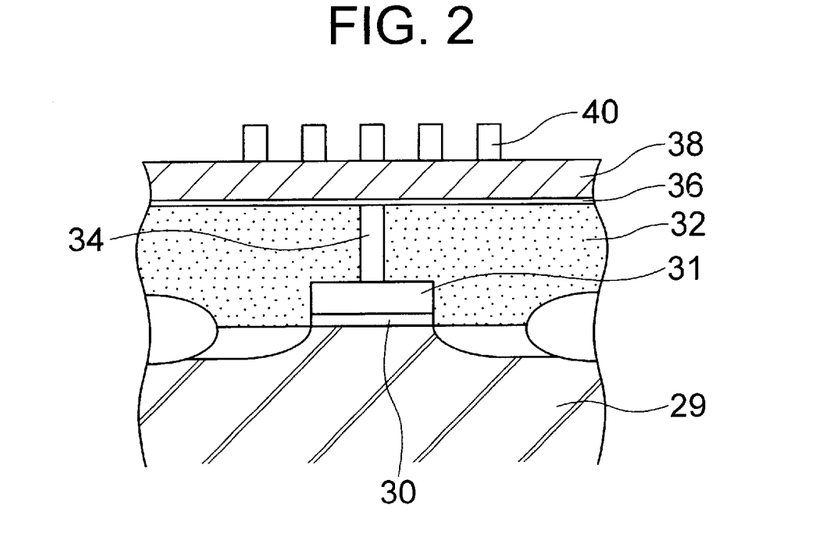
FIG. 2 is a cross-sectional view showing an interconnect specimen used in experiments.

The present inventors have conducted a series of experiments by using an interconnect specimen shown in FIG. 2 for elucidating a relation between the etching conditions and the variation of the threshold voltage of the MOSFET.

The interconnect specimen shown in FIG. 2 included a substrate 29, a gate electrode 30 overlying the substrate 29 by way of a gate dielectric film 31 formed in an interlayer dielectric film 32, and a barrier metal layer 36 having a thickness of 1200 Å and an aluminum interconnect layer 38 having a thickness of 6000 Å which were accumulated by sputtering on the interlayer dielectric film 32 and were connected to the gate electrode 30 by way of a via plug 34. The barrer metal layer 36 was a stacked film of TiN layer (film thickness of 1000 Å)/Ti layer (film thickness of 200 Å), and the aluminum interconnect layer 38 contained 0.5% in weight of copper and a balance of aluminum.

A photoresist film having a thickness of 9000 Å was deposited on the aluminum interconnect layer 38, and an etching mask 40 having a specified interconnect pattern was photolithographically formed.

The etching mask 40 had an interconnect width of 0.28 μm, and various interconnect patterns were provided having an interconnect interval "S" and an antenna ratio "A/R" as parameters. The respective experiments were conducted by using the etching masks having the different interconnect patterns. In the experiments, the interconnect interval "S" was 0.3 μm≦S≦0.8 μm, and the antenna ratio "A/R" was 90≦A/R≦45,220, and Tox=60 Å, L/W=0.25/10 μm.

In the experiments, the aluminum interconnect layer 38 was etched under the following conditions by employing an inductive coupling type etching device.
Etching Conditions
 Chamber Pressure: 15 mTorr.
 Substrate Temperature: 60° C.
 RF Source Power Input: 600 W
 RF Bias Power Input: 200 W
 Etching Gas: $BCl_3$/100 sccm, Cl/60 sccm, $CHF_3$/0 to 40 sccm (the flow rate of the $CHF_3$ gas was used as a parameter)
Relation Between ΔVt and Amount of Added $CHF_3$ Interconnects were formed by etching the interconnect specimens under the above etching conditions by using etching masks having an antenna ratio of 11,373 and different interconnect intervals and by using the flow rate of the $CHF_3$ gas as a parameter. Then, an n-channel MOSFET was fabricated by using the interconnects. Before conducting a hydrogen annealing treatment to the n-channel MOSFET, an amount of variation of the threshold voltage of the MOSFET (ΔVt) was measured. The relation between the ΔVt and the amount of the added $CHF_3$ is as shown in FIG. 3.

Figure 3:
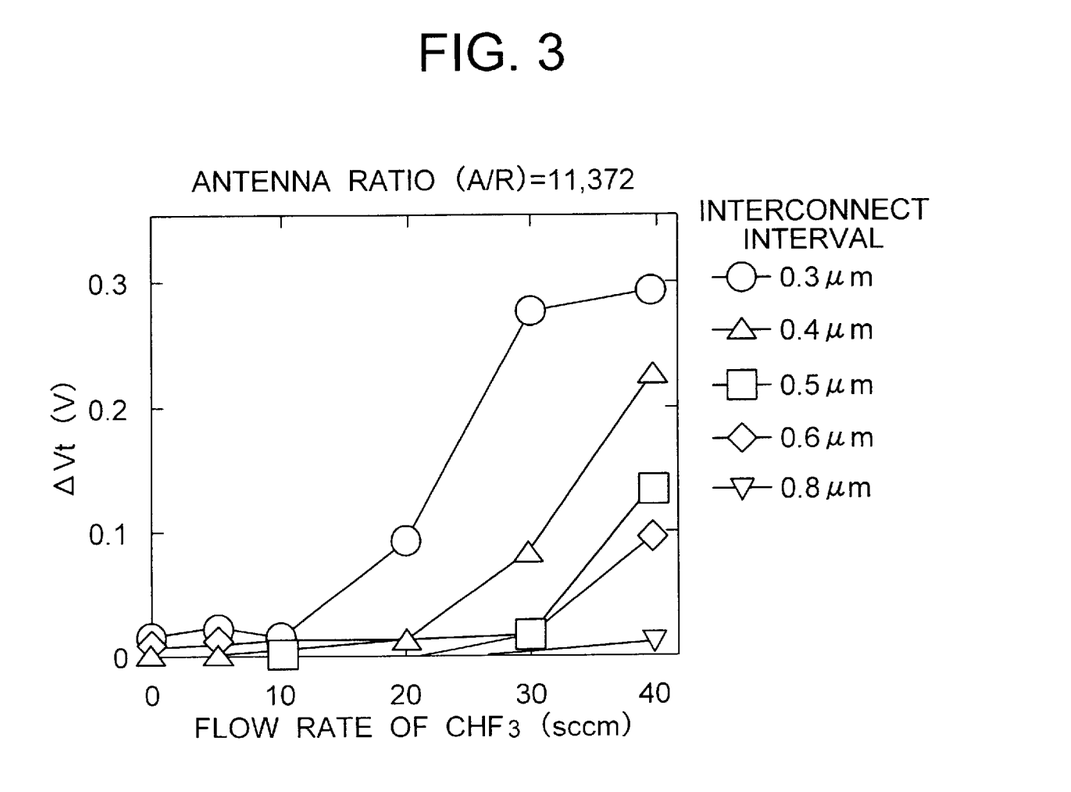
FIG. 3 is a graph showing a relation between a variation amount of a threshold voltage ($\Delta Vt$) and an amount of added $CHF_3$.
Figure 4A:
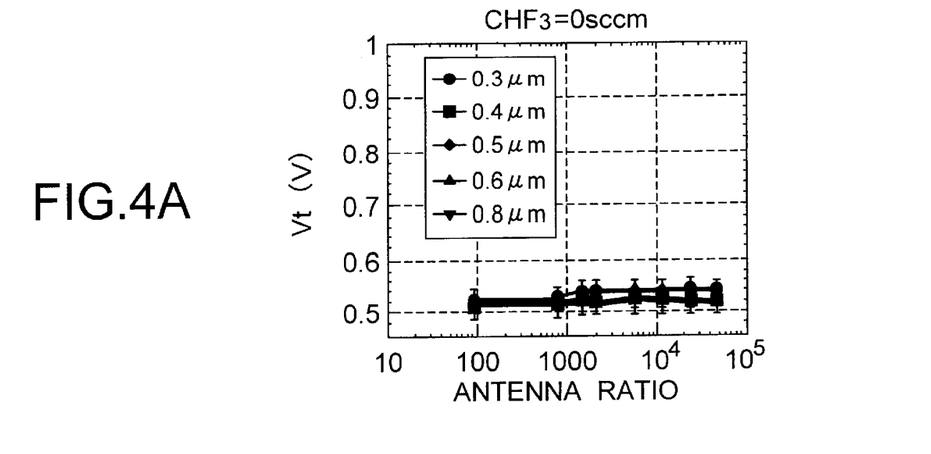
FIGS. 4A to 4E are graphs showing relations between antenna ratios "A/R" and Vts.
Figure 4B:
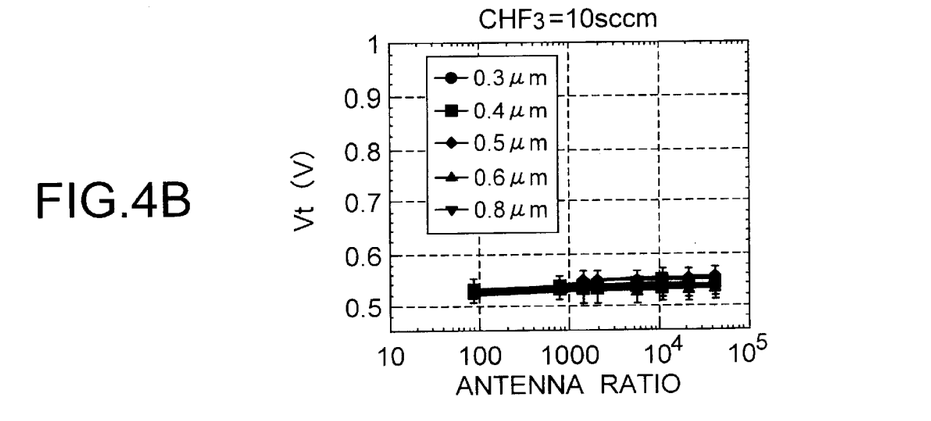
Figure 4C:
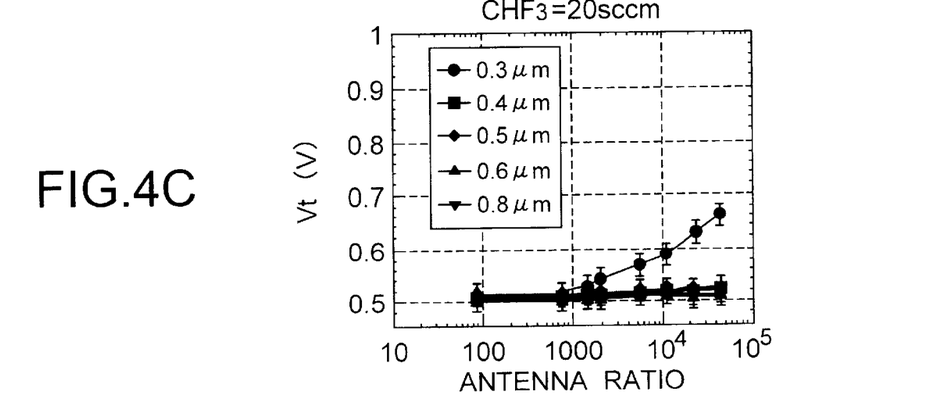
Figure 4D:
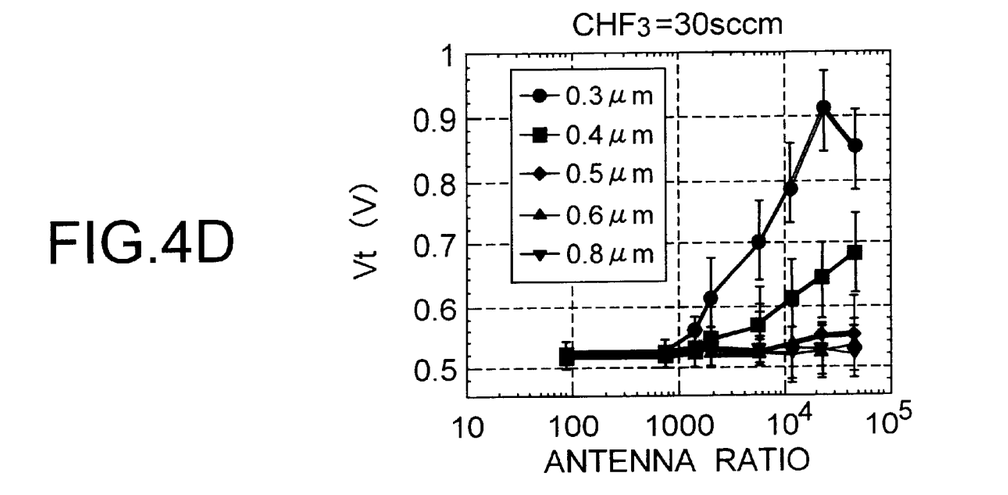
Figure 4E:
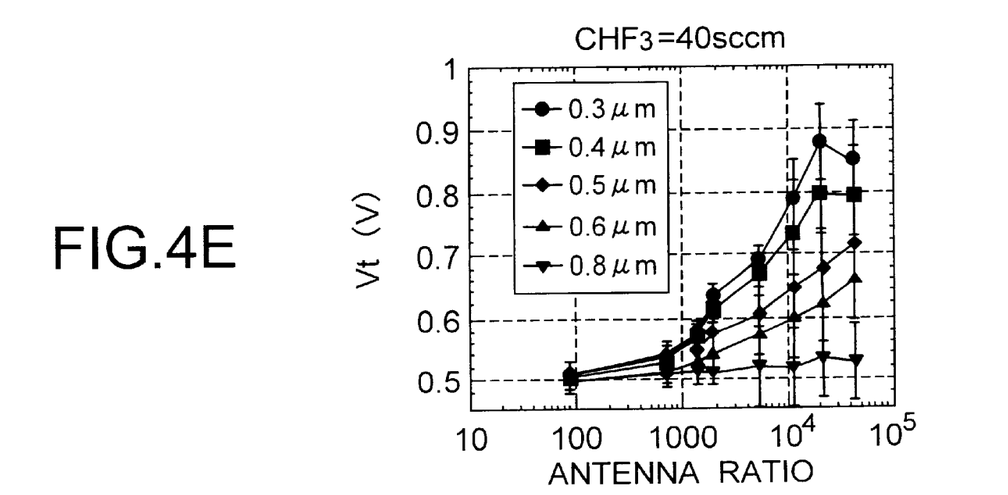

As apparent from FIG. 3, while the ΔVt did not exhibit the dependency on the amount of the $CHF_3$ in case that the interconnect interval was 0.8 μm, the ΔVt was closely related with the amount of the $CHF_3$ in case that the interconnect interval was 0.6 μm or less, especially 0.4 μm and 0.3 μm.

That is, in case that the interconnect interval was 0.6 μm or less, the ΔVt increased with the amount of the $CHF_3$, and the ΔVt more rapidly increased with the addition of the smaller amount of the $CHF_3$ when the interconnect interval became narrower. At the minimum interval of 0.3 μm, the ΔVt was equilibrated at the amount of the $CHF_3$ of 30 sccm or more.

It has been found from the foregoing that the ΔVt, an index of the charging damage of the MOSFET, is significantly affected by the amount of the added $CHF_3$.
Relation Between ΔVt and Antenna Ratio Then, the relation between the antenna ratio "A/R" and the threshold voltage "Vt" was investigated by using the addition amount of the $CHF_3$ as a parameter and further respective interconnect intervals for each amount of the $CHF_3$ as a further parameter. The amounts of the $CHF_3$ were determined to be 0 sccm, 10 sccm, 20 sccm, 30 sccm and 40 sccm For each of the amounts of the CHF$_3$, the interconnect intervals were set to be 0.8 μm, 0.6 μm, 0.5 μm, 0.4 μm and 0.3 μm. Under the respective conditions, the ΔVts at the antenna ratios from 100 to 5×10$^4$ were measured, and the results are shown in FIGS. 4A to 4E.

As apparent from FIGS. 4A to 4E, the variation rate of "Vt" became larger with the increase of the antenna ratio "A/R" for the specimens having the increased amount of the CHF$_3$ and the reduced interconnect interval. Especially, the Vt was fluctuated even for the broader interconnect interval when the amount of the CHF$_3$ was 20 sccm or more.

Figure 5A:
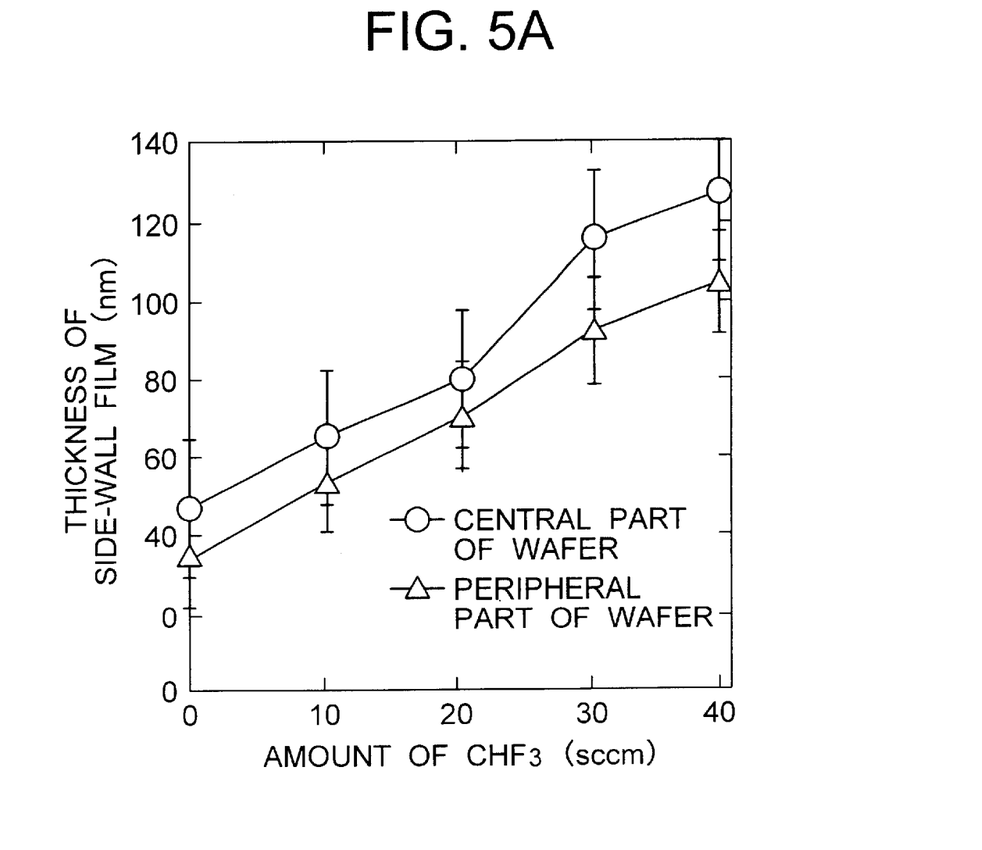
FIG. 5A is a graph showing a relation between a thickness of a side-wall film and the amount of the added $CHF_3$.
Figure 5B:
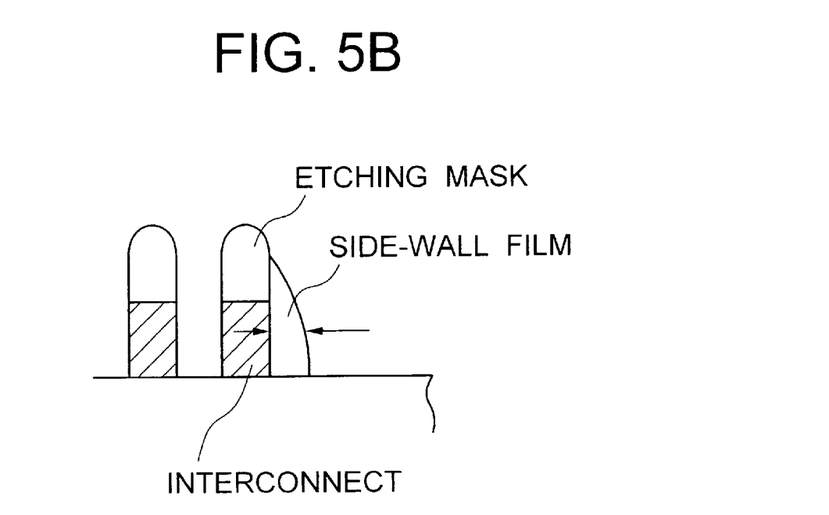
FIG. 5B is a schematic view showing a point where the thickness is measured.

Relation Between Amount of CHF$_3$ and Thickness of Side-Wall Film Deposited on Side Wall The relation between the film thickness of the side-wall film on the side wall of the outermost interconnect and the amount of the CHF$_3$ was investigated for the central part and the peripheral part of the wafer, and the results are shown in FIG. 5A. The thickness of the side-wall film was measured, as specified in FIG. 5B, at the central part of the longitudinal direction of the side-wall film deposited on the outermost interconnect by using a scanning electron microscope (SEM) for sections.

As shown in FIG. 5A, the results indicate that the thickness of the side-wall film monotonously increases with respect to the amount of the added CHF$_3$.

Relation Between Thickness of Side-Wall Film Deposited on Side Wall and ΔVt

Figure 6:
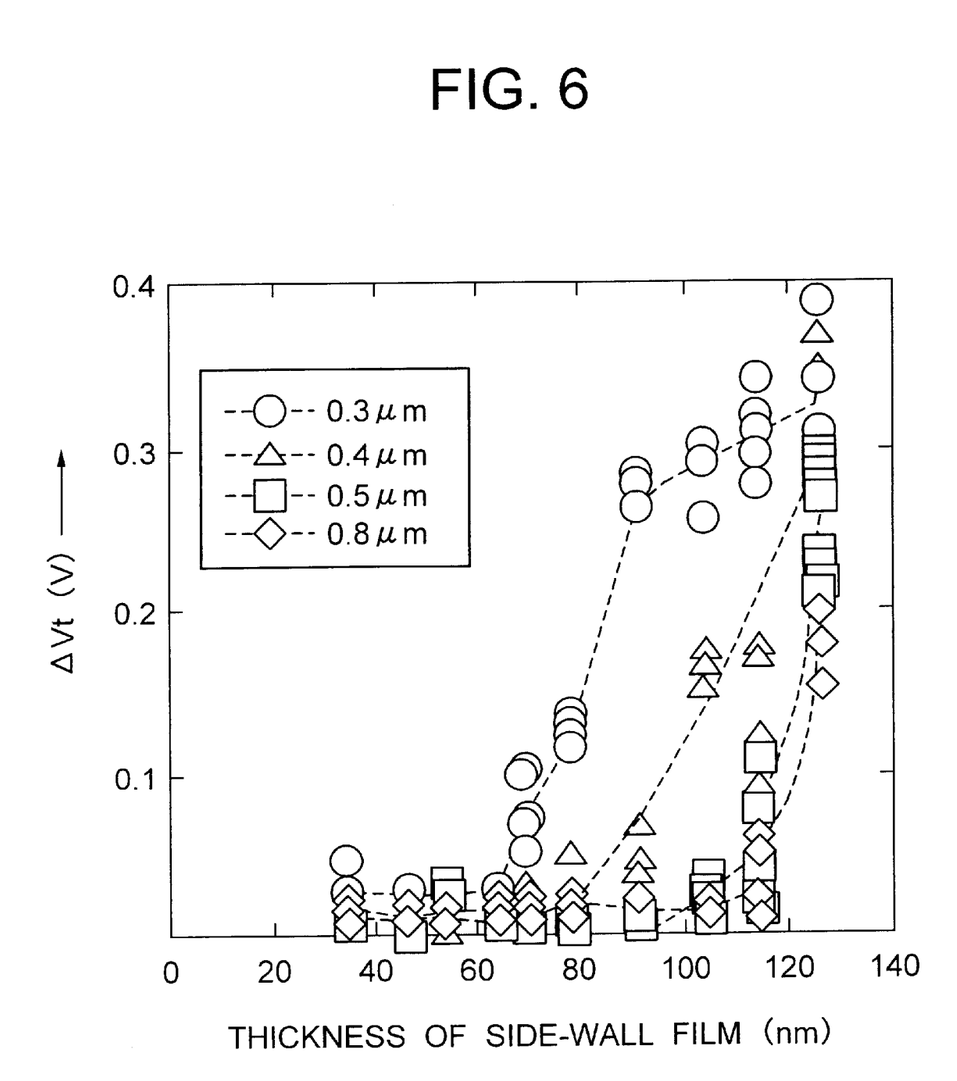
FIG. 6 is a graph showing a relation between the thickness of the side-wall film and the ΔVt taking an interconnect interval as a parameter.

The relation between the film thickness of the side-wall film on the side wall of the outermost interconnect and the ΔVt at the antenna ratio "A/R" of 11,000 was investigated by using the interconnect intervals of 0.3 μm, 0.4 μm, 0.5 μm and 0.8 μm as a parameter, and the results are shown in FIG. 6.

As shown therein, the ΔVt is dependent on the thickness of the side-wall film on the side wall of the outermost interconnect in the thickness range over 60 nm, and is significantly dependent on the film thickness when the interconnect interval becomes smaller. For example, when the interconnect interval is 0.4 μm or 0.3 μm, the dependency of the ΔVt on the thickness of the side-wall film is significant.

Especially, at the interconnect interval of 0.3 μm, the above dependency is quite prominent even for the thin film thickness, and the ΔVt sharply increases at the relatively thin film thickness. The minimum thickness of the side-wall film for suppressing the side etching is between about 60 nm and 80 nm.

In view of the values of the ΔVt, the index of the charging damage of the MOSFET, the charging damage is largely affected by the thickness of the side-wall film deposited on the side wall of the outermost interconnect. FIG. 6 shows that the degree of the increase of the ΔVt or the charging damage of the MOSFET may be within the permitted range as described in relation with the embodiment, when the thickness of the side-wall film on the side wall of the outermost interconnect is 80 nm or less. On the other hand, in order to suppress the side etching, the side-wall film is required to have the thickness to a certain extent, for example, about 60 nm to 80 nm.

Figure 7A:
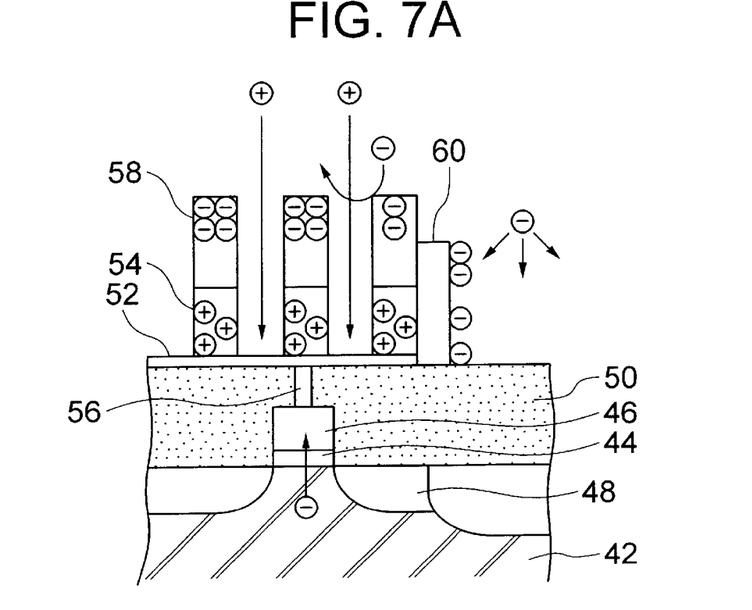
FIGS. 7A and 7B are schematic sectional views describing interactions between the side-wall films and electrons when the thicknesses of the side-wall films are thicker and thinner, respectively.
Figure 7B:
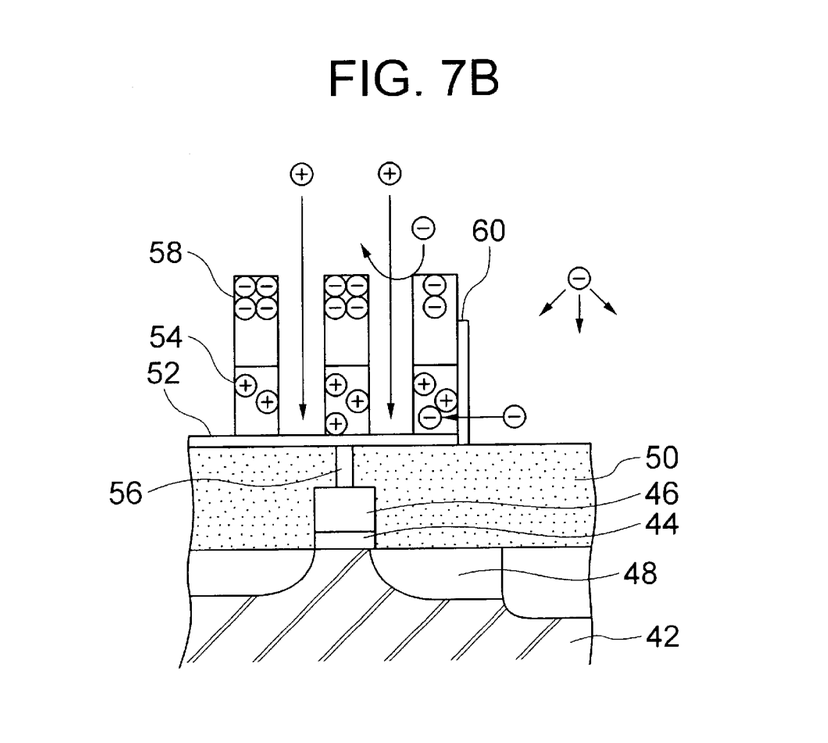

Consideration to Interaction Between Side-Wall Film Deposited on Side Wall of Interconnect and Electron The etchings of interconnect layers overlying gate electrodes of MOSFETs shown in FIGS. 7A and 7B describing the interaction between the side-wall film and electrons in case of the thick side-wall film and the thin side-wall film, respectively, are taken into consideration as models.

In FIGS. 7A and 7B, a gate electrode 46 is formed overlying a silicon substrate 42 by way of a gate dielectric film 44, and diffused regions 48 are formed in the silicon substrate 42 at both sides of the gate electrode 46. An interconneet layer 54 is formed, by way of a barrier metal layer 52, on a dielectric film 50 covering the gate electrode 46. The barrier metal layer 52 is connected to the gate electrode 46 by way of a via plug 56 penetrating the dielectric film 50.

An etching mask 58 made by a photoresist film is formed on the interconnect layer 54, and the interconnect layer 54 corresponding to the opening of the etching mask 58 is etched to expose the barrier metal layer 52.

With the progress of the etching of the interconnect layer 54, a reaction product between the photoresist material constituting the etching mask 58 and the etching gas is deposited on the side wall of the interconnects, especially, of the outermost interconnect to form the side-wall film 60. The side-wall film is ordinarily dielectric.

Generally, due to the electron shading effect, the etching mask 58 is negatively charged and the interconnect layer 54 is positively charged. As a whole, the positive charge of the interconnect layer 54 is larger to generate a charging imbalance.

Electrons existing in an open space side or outside the outermost interconnect are drawn toward the positively charged side wall of the interconnect as shown in FIGS. 7A and 7B.

When the side-wall film 60 is thicker as shown in FIG. 7A, the charging imbalance is scarcely removed because the electron tunneling effect for tunneling the electrons through the side-wall film is small. However; by applying the positive charge in the interconnect layer 54 to the gate electrode 44 by way of the barrier metal layer 52, the potential of the gate electrode 44 is elevated to form an electric field between the gate electrode 44 and the substrate 42 so that the electrons penetrate from the substrate 42 to cancel the charging imbalance.

During the penetrating of the electrons, the gate dielectric film 48 is damaged or charged-up, and the Vt changes, or the charging damage of the MOSFET is generated. The electron tunneling effect affected by the dielectric property of the side-wall film depends on the film property of the side-wall film, accordingly, on the properties of the etching gas and of the etching mask.

On the other hand, when the side-wall film 60 of the outermost interconnect is thinner as shown in FIG. 7B, the charging imbalance of the interconnect layer 54 is reduced because the electrons tunnel the side-wall film, in accordance with the electron tunneling effect, to reach to the outermost interconnect, and the electrons further penetrate to the other interconnects through the barrier metal layer 52 to counterbalance the stored positive charge, Accordingly, the electrons do not penetrate from the substrate 42 through the gate dielectric film 44 opposite to the case when the film thickness is thick. The gate dielectric film 44 is not damaged, and no variation of the Vt appears, or the charging damage of the MOSFET is not generated.

Based on the above experimental results, it is concluded that the distinct correlation is present between the thickness of the side-wall film of the outermost interconnect and the ΔVt or the charging damage during the etching of the interconnect layer. It is experimentally confirmed that, especially when the thickness of the side-wall film is 80 nm or more, the ΔVt significantly increases or the degree of the charging damage increases as shown in FIG. 6.

The charging damage is generated during the etching process and before the completion of the etching in which each of the interconnects is connected with one another by way of the barrier metal layer, as described above.

In accordance with the present invention, the drawback of the prior art can be eliminated.

In the present invention, the critical film thickness of the side-wall film deposited on the side wall of the interconnect means the minimum thickness required for suppressing the side etching of the interconnect, usually between about 60 nm and 80 nm.

The material of the interconnect used in the present invention is not especially restricted, and such metal as aluminum and tungsten, such alloy as aluminum alloy and tungsten alloy, such silicide as tungsten silicide and polysilicon may be employed.

The $CHF_3$ is suitably used as the fluorocarbon-based gas, but other fluorocarbon-based gases may be also used. The flow rate of the $CHF_3$ gas, the pressure of the etching chamber and the substrate temperature may be controlled such that the thickness of the side-wall film deposited on the side wall of the outermost interconnect is between the critical thickness and 80 nm.

Although the method of the present invention may be applied to the formation of the interconnects regardless of the kinds of the semiconductor devices, the method is best suited for forming the interconnect by etching, by means of the dry etching process, the interconnect layer connected to the gate electrode of the MOSFET by way of the via plug.

Since the above embodiments are described only for examples, the present invention is not limited to the above embodiments and various modifications or alternations can be easily made therefrom by those skilled in the art without departing from the scope of the present invention.

What is claimed is:

1. A method for forming interconnects of a semiconductor device, comprising the steps of:

depositing an interconnect layer on an insulator layer overlying a substrate; and etching the interconnect layer by using an etching gas to form a plurality of interconnects extending with a specified line space, said etching step depositing a side-wall film on each side wall of each of said interconnects;

said etching step including adjusting an amount of a fluorocarbon-based gas added to said etching gas to control a thickness of said side-wall based on the specified line space, said side-wall film having a minimum thickness of at least 60 nanometers for suppressing charging damage during etching of the interconnection layer.

2. The method as defined in claim 1, said adjusting step is such that the side-wall film deposited on the side wall of the outermost interconnect has a larger thickness for a case of a first line space compared to a case of a second line space which is smaller than said first line space.

3. The method as defined in claim 1, wherein said fluorocarbon-based gas includes $CHF_3$, and said side-wall film of said one of said interconnects has a thickness between 60 and 80 nanometers.

4. The method as defined in claim 3, wherein said etching step includes adjusting a pressure of an etching chamber and a substrate temperature in addition to said adjusting the amount of fluorocarbon-based gas by adjusting a flow rate of $CHF_3$.

5. The method as defined in claim 1, wherein said interconnect layer is electrically connected to a gate electrode.

6. The method for forming interconnects of a semiconductor device, comprising the steps of:

depositing an interconnect layer on an insulator layer overlying a substrate; and etching the interconnect layer by using an etching gas to form a plurality of interconnects extending with a specified line space, said etching step depositing a side-wall film on each side wall of each of said interconnects;

said etching step including adjusting an amount of a fluorocarbon-based gas added to said etching gas to control a thickness of said side-wall based on the specified line space, said side-wall film having at least a critical thickness for suppressing etching of the corresponding side wall, wherein said adjusting step is such that the side-wall film deposited on the side wall of the outermost interconnect has a larger thickness for a case of a first line space compared to a case of a second line space which is smaller than said first line space.

7. The method as defined in claim 6, wherein said fluorocarbon-based gas includes $CHF_3$, and said side-wall film of said one of said interconnects has a thickness between said critical thickness and 80 nanometers.

8. The method as defined in claim 7, wherein said etching step includes adjusting a pressure of an etching chamber and a substrate temperature in addition to said adjusting the amount of fluorocarbon-based gas by adjusting a flow rate of $CHF_3$.

9. The method as defined in claim 6, wherein said interconnect layer is electrically connected to a gate electrode.

10. A method for forming interconnects of a semiconductor device, comprising the steps of:

depositing an interconnect layer on an insulator layer overlying a substrate; and etching the interconnect layer by using an etching gas to form a plurality of interconnects extending with a specified line space, said etching step depositing a side-wall film on each side wall of each of said interconnects;

said etching step including adjusting an amount of a fluorocarbon-based gas added to said etching gas to control a thickness of said side-wall based on the specified line space, said side-wall film having at least a critical thickness for suppressing etching of the corresponding side wall, wherein said fluorocarbon-based gas includes $CHF_3$, and said side-wall film of said one of said interconnects has a thickness between said critical thickness and 80 nanometers, and wherein said etching step includes adjusting a pressure of an etching chamber and a substrate temperature in addition to said adjusting the amount of fluorocarbon-based gas by adjusting a flow rate of $CHF_3$.

11. The method as defined in claim 10, wherein said interconnect layer is electrically connected to a gate electrode.

* * * * *